United States Patent
Yoshida

(10) Patent No.: US 9,012,080 B2
(45) Date of Patent: Apr. 21, 2015

(54) NEEDLE-LIKE MICROSTRUCTURE AND DEVICE HAVING NEEDLE-LIKE MICROSTRUCTURE

(75) Inventor: Yasunori Yoshida, Aichi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 47 days.

(21) Appl. No.: 13/232,022

(22) Filed: Sep. 14, 2011

(65) Prior Publication Data
US 2012/0070738 A1 Mar. 22, 2012

(30) Foreign Application Priority Data

Sep. 21, 2010 (JP) ................................. 2010-210579

(51) Int. Cl.
*H01M 4/13* (2010.01)
*C01B 33/06* (2006.01)
*H01L 31/0236* (2006.01)
*H01L 31/0352* (2006.01)
*H01L 31/075* (2012.01)
*H01L 31/18* (2006.01)
*H01M 4/134* (2010.01)
*H01M 4/1395* (2010.01)
(Continued)

(52) U.S. Cl.
CPC ............ *C01B 33/06* (2013.01); *C01P 2004/04* (2013.01); *H01L 31/02363* (2013.01); *H01L 31/03529* (2013.01); *H01L 31/075* (2013.01); *H01L 31/182* (2013.01); *H01M 4/134* (2013.01); *H01M 4/1395* (2013.01); *H01M 4/366* (2013.01); *H01M 10/0525* (2013.01); *Y02E 60/122* (2013.01); *Y02E 10/546* (2013.01); *Y02E 10/548* (2013.01)

(58) Field of Classification Search
CPC ........................... H01M 4/1395; H01M 4/366
See application file for complete search history.

(56) References Cited

U.S. PATENT DOCUMENTS

| | | | |
|---|---|---|---|
| 6,514,395 B2 * | 2/2003 | Zhou et al. | 204/409 |
| 2011/0117436 A1 * | 5/2011 | Ma et al. | 429/231.8 |
| 2011/0151290 A1 | 6/2011 | Cui et al. | |

FOREIGN PATENT DOCUMENTS

| | | |
|---|---|---|
| JP | 2003-246700 | 9/2003 |
| JP | 2004-281317 | 10/2004 |

OTHER PUBLICATIONS

Chan.C et al., "High-performance lithium battery anodes using silicon nanowires," *Nature Nanotechnology*, vol. 3, pp. 31-35, Jan. 2008

(Continued)

*Primary Examiner* — Helen O Conley
(74) *Attorney, Agent, or Firm* — Nixon Peabody LLP; Jeffrey L. Costellia

(57) ABSTRACT

A needle-like structure of silicon is provided. A crystalline silicon region is formed over a metal substrate by an LPCVD method, whereby whisker-like crystalline silicon which is a polycrystalline body and grows in the <110> direction or the <211> direction with {111} the plane as a twin boundary can be obtained. Whisker-like crystalline silicon grows while forming a twin crystal (introducing stacking faults), and an initial nucleus is provided so that the normal direction <111> of the twin boundary is always included in the plane perpendicular to the growth direction of whisker-like crystalline silicon (in a transverse cross section). Such a material is used as a negative electrode active material of a lithium-ion secondary battery and for a photoelectric conversion device such as a solar battery.

18 Claims, 12 Drawing Sheets

(51) Int. Cl.
*H01M 4/36* (2006.01)
*H01M 10/0525* (2010.01)

(56) References Cited

OTHER PUBLICATIONS

Miyamoto et al., "Polytypism and Amorphousness in Silicon Whiskers", *Journal of the Physical Society of Japan*, vol. 44, No. 1, pp. 181-190, Jan. 1978.

Cui et al., "Crystalline-Amorphous Core-Shell Silicon Nanowires for High Capacity and High Current Battery Electrodes", *Nano Letters*, vol. 9, No. 1, pp. 491-495, 2009.

Kohno et al., "Chains of crystalline-Si nanospheres: growth and properties," *e-Journal of Surface Science and Nanotechnology*, vol. 3 pp. 131-140, Apr. 19, 2005.

Kohno et al. "Plasmon-loss imaging of chains of crystalline-silicon nanospheres and silicon nanowires," *Journal of Electron Microscopy*, vol. 49(2) pp. 275-280, 2000.

Kohno et al. "Periodic instability in growth of chains of crystalline-silicon nanospheres " *Journal of Crystal Growth*, vol. 216 pp. 185-191, 2000.

Kohno et al. "Metal-mediated growth of alternate semiconductor-insulator nanostructures," *Solid State Communications*, vol. 116, pp. 591-594, 2000.

Kohno et al. "Le'vy-type complex diameter modulation in semiconductor nanowire growth," *Solid State Communications*, vol. 132, pp. 59-62, 2004.

K. Mori et al., "Core-shell SiGe whiskers with composition gradient along the axial direction: Cross-sectional analysis", *Applied Physics Letters*, vol. 87, pp. 083111/1-083111/3, 2005.

H. Kohno et al., "Infusing metal into self-organized semiconductor nanostructures", *Applied Physics Letters*, vol. 83, No. 6, pp. 1202-1203, Aug. 11, 2003.

H. Kohno et al., "Self-organized chain of crystalline-silicon nanospheres", *Applied Physics Letters*, vol. 73, No. 21, pp. 3144-3146, Nov. 23, 1996.

H. Kohno et al., "Multiscaling in semiconductor nanowire growth", *Physical Review E.*, vol. 70, pp. 062601/1-062601/3, 2004.

Kamins et al., "Ti-catalyzed Si nanowires by chemical vapor deposition: Microscopy and growth mechanisms", Journal of Applied Physics, vol. 89, No. 2, Jan. 15, 2001, pp. 1008-1016.

Kohno et al., "Silicon Nanoneedles Grown by a Simple Thermal Treatment Using Metal-Sulfur Catalysts", Jpn. J. Appl. Phys., vol. 41, Part 1, No. 2A, Feb. 2002, pp. 577-578.

* cited by examiner

NEEDLE-LIKE MICROSTRUCTURE AND DEVICE HAVING NEEDLE-LIKE MICROSTRUCTURE

BACKGROUND OF THE INVENTION

1. Field of the Invention

The present invention relates to a needle-like microstructure, particularly to a needle-like semiconductor.

2. Description of the Related Art

A needle-like microstructure, with its external characteristics, is expected to be applied to a power storage device and the like including an electron beam emission source (an emitter), a microprobe (such as an STM, an AFM, and an electrode array), an optical device (such as a dye sensitization solar battery and a device having a light trapping structure), or an ion-transferring secondary battery (such as a lithium ion battery).

As a needle-like microstructure of silicon, a silicon nanoneedle formed by the vapor-liquid-solid (VLS) growth method is known. A silicon nanoneedle is a single crystal needle-like structure; for example, the diameter of an end portion is 300 nm or less, the length is 90 μm or less, and the growth direction is <111>. The description of a silicon nanoneedle is disclosed in Patent Document 1 and Non-Patent Document 1.

REFERENCE

Patent Document

[Patent Document 1] Japanese Published Patent Application No. 2003-246700

Non-Patent Document

[Non-Patent Document 1] T. I. Kamins et al., "Ti-catalyzed Si nanowires by chemical vapor deposition: Microscopy and growth mechanisms", J. Appl. Phys. Vol. 89, pp. 1008-1016, 2001.

SUMMARY OF THE INVENTION

An object of the present invention is to provide a novel needle-like structure containing silicon as its main component. Further, another object of the present invention is to provide a device including such a needle-like structure.

A needle-like polycrystalline silicon structure which grows in the <110> direction with the {111} plane as a twin boundary and a needle-like polycrystalline silicon structure which grows in the <211> direction with the {111} plane as a twin boundary can be obtained. Note that the concentration of elements other than silicon in the needle-like polycrystalline silicon structure is less than or equal to 5 atomic %, preferably less than or equal to 1 atomic %.

Crystalline silicon is formed on a metal substrate such as a titanium substrate by an LPCVD method (at about 600° C., for about 2 hours), whereby a needle-like structure having a peculiar shape which is different from that of the silicon nanoneedle can be obtained. The needle-like structure formed using crystalline silicon is referred to as whisker-like crystalline silicon (or simply referred to as a whisker). The diameter of whisker-like crystalline silicon is about 1 μm to 2 which is relatively large, and the length of whisker-like crystalline silicon is typically about 10 μm.

One of the peculiar points of whisker-like crystalline silicon is that two kinds of whiskers having distinctly different external shapes exist. One of the whiskers is relatively thick, and has a shape whose diameter is not changed so much from the root to the tip (a pillar shape), and the other of the whiskers is relatively thin, and has a shape whose thickness of the whisker is gradually decreased from the root to the tip so as to have a sharp end (a cone shape) (see FIG. 1A).

Another peculiar point is that whisker-like crystalline silicon is a polycrystalline body formed of a group of microcrystals, which is different from a silicon nanoneedle formed by VLS growth and has a preferred orientation. The preferred orientation depends on the shape of whisker-like crystalline silicon; a pillar-shaped whisker has the <211> preferred orientation (extension direction) which is parallel to the growth direction. On the other hand, the research up till now using TEM observation and an electron diffraction method showed that the cone-shaped whisker has the <110> preferred orientation which is parallel to the growth direction.

A cross-sectional TEM image of the pillar-shaped whisker shows that the contrast depending on diffraction conditions is extending radially from the center line (FIG. 2A). Further, since the appearance of the contrast varies depending on the inclination angle, it can be found that the whisker-like crystalline silicon is a polycrystalline body. From the diffraction pattern of the portion that looks dark (FIG. 2B) at the inclination angle, it was found that the portion that looks dark has a crystal structure in which two $\Sigma=3$ twins of silicon overlap with each other at an angle of approximately 35°.

In the diffraction pattern in FIG. 2B, the twin boundaries of the two $\Sigma=3$ twins of silicon (each referred to as a twin crystal a and a twin crystal b) are planes in which the directions in which streaks extend, <111>(a1) and <111>(b1), are normal directions. Other <111> directions of each of the twin crystal a and the twin crystal b, that is, <111>(a2) and <111>(b2), correspond to each other and a new twin crystal c is formed. The twin boundary of the new twin crystal c is a plane in which the direction perpendicular to the growth direction (the extension direction) <111>(c) of the pillar-shaped whisker in FIG. 2A is a normal direction. Therefore, the growth direction of the pillar-shaped whisker is substantially the same as the direction <211>(c).

A cross-sectional TEM image of the cone-shaped whisker shows the same contrast as the pillar-shaped whisker, and it can be found that the cone-shaped whisker is also a polycrystalline body (FIG. 3A). However, the preferred orientation is different from that of the pillar-shaped whisker. The diffraction pattern of the cross section of the cone-shaped whisker (FIG. 3B) shows the same pattern as the <100> incidence diffraction pattern of silicon single crystal, and the growth direction of the whisker is substantially the same as the <110> direction. Further, although the diffraction is observed from substantially the same location in the sample, a plurality of zone axis patterns (<110> and <111>) were obtained (see FIG. 4A and FIG. 4B), when the diffraction pattern at a different inclination angle is examined. Those diffraction patterns also show that the growth direction of the whisker is substantially the same as the <110> direction. Therefore, it can be said that the preferred orientation of the cone-shaped whisker is <110>, which is parallel to the growth direction.

The range of the sample inclination angle of the TEM (H-9500: manufactured by Hitachi, Ltd.), which was used for the above-described observation is from plus 15° to minus 15°. In the case where whisker-like crystalline silicon is single crystal silicon, a plurality of zone axis patterns cannot be obtained with such a small range of the sample inclination angle. In view of this point, it can be said that whisker-like crystalline silicon is a polycrystalline body. Note that it can also be said that since a diffraction pattern based on a single crystal is obtained, whisker-like crystalline silicon is not random polycrystalline but polycrystalline which has the preferred orientations (cone-shaped: <110>, pillar-shaped: <211>). Further, because a variety of diffraction patterns of the zone axes are obtained from substantially the same location in the sample; therefore, the polycrystalline is probably formed of minute crystal grains which exist so as to be mixed with each other in a small area.

As described above, the pillar-shaped whisker has a relationship with twin crystal. As for the cone-shaped whisker, the diffraction pattern of the twin crystal is also obtained in another transverse cross section formed by changing the direction of slice processing. Although the presence and directions of the streaks are different from those of a pillar-shaped whisker, the diffraction pattern is the same as the pattern shown in FIG. 2B. This suggests that the cone-shaped whisker has also a crystal structure in which a new twin crystal is formed by two Σ=3 twins of silicon. The difference between the cone-shaped whisker and the pillar-shaped whisker is likely that the <110> zone axis which is included in each of the twin boundaries ({111} plane) of a plurality of twin structures is perpendicular (pillar-shaped) or parallel (cone-shaped) to the growth direction of the whisker-like crystalline silicon.

Since a cone-shaped whisker and a pillar-shaped whisker probably have substantially the same twin structure, the present inventor has thought that there may be some points of similarity in crystal growth pattern. Thus, a model of <111> twin growth is proposed as a model of crystal growth in order to describe a peculiar crystal structure of whisker-like crystalline silicon.

This model is based on the following premises: (1) the growth direction is limited to the <111> direction and the crystals grow by twin growth (introducing stacking faults), and (2) an initial nucleus is provided so that the normal direction <111> of the twin boundary is always included in the plane perpendicular to the growth direction of whisker-like crystalline silicon (in a transverse cross section).

These premises are not always clear; however, considering that the crystal has anisotropy in crystal growth rate of silicon and the <111> direction is the lowest, (1) probably be a valid premise.

As described above, (2) is a premise which is based on the normal direction <111> of the twin boundary of a "new twin structure" always existing in a transverse cross section both in the pillar-shaped whisker and in the cone-shaped whisker.

In the initial nucleus described in the premise (2), at least one <111> direction is required to exist in a transverse cross section. The crystal orientation which satisfies the requirement and has a high symmetry property viewed from the growth direction of whisker-like crystalline silicon is limited to <110> or <211>. This corresponds to the fact that the actual crystal orientation of whisker-like crystalline silicon is also limited to <110> or <211>. Therefore, the validity of the premise (2) is indicated.

The crystal orientation <211> viewed from the growth direction of whisker-like crystalline silicon is used for the initial nucleus of a pillar-shaped whisker (FIG. 5A) and the crystal orientation <110> viewed from the growth direction is used for the initial nucleus of a cone-shaped whisker (FIG. 6A).

Then, crystal growth from the initial nucleus will be described below. According to the premise (1), the growth direction is limited to the <111> direction. That is, there is only one direction in a horizontal plane direction in which a pillar-shaped whisker grows (a longitudinal direction in FIG. 5A). Similarly to the crystal growth in the horizontal plane direction, twin growth is performed in the <111> direction in the other three directions which are not on the horizontal plane. A cone-shaped whisker grows in two horizontal plane directions. The growth of the whisker in the directions which are not on the horizontal plane is performed in the other two directions.

The crystal orientations of the pillar-shaped whisker and the cone-shaped whisker in each of which twin crystal grew in all <111> directions (4 directions) are illustrated in FIG. 5B and FIG. 6B, respectively.

As illustrated in FIG. 5B, in the case where the one-step growth of the pillar-shaped whisker is performed, crystal growth in the depth direction in the drawing is performed in three of the four <111> directions, and crystal growth in the horizontal plane direction is performed in the other direction. Due to the crystal growth in the depth direction in the drawing, two portions which have nearly <721> directions viewed from the growth direction of whisker-like crystalline silicon and one portion which has a nearly <377> direction viewed from the growth direction appear. The portion which appears in the horizontal plane direction has the <211> direction, the same direction as the initial nucleus. Note that each of the four portions forms a twin crystal with the initial nucleus.

On the other hand, as illustrated in FIG. 6B, in the case where the first-step growth of the cone-shaped whisker is performed, the crystal growth in the depth direction in the drawing is performed in two of the four <111> directions, and the crystal growth in the horizontal plane direction is performed in the other two directions. Due to the crystal growth in the depth direction in the drawing, two portions which have nearly <411> directions viewed from the growth direction of whisker-like crystalline silicon appear. The portions which appear in the horizontal plane direction have the <110> direction, the same direction as the initial nucleus.

Note that the stepwise growth in which a unit cell is defined as one unit is used in the explanation of the model for convenience. The actual growth is probably performed continuously regardless of a unit cell.

Next, (some of) crystal orientations in the case of the second-step growth of the pillar-shaped whisker are shown in FIG. 7. In the case of the upward second-step growth of the pillar-shaped whisker, further twin growth in the <111> direction is performed in portions having the <377> direction and portions having the <721> direction, which appeared in the second layer. Portions (two directions) in which the twin growth is performed in the <111> direction from the portion having the <377> direction is in the nearly, but not exactly, horizontal plane. When the second-step growth of the pillar-shaped whisker is performed in the <111> direction which is in the nearly horizontal plane, the crystal orientation is substantially the <211> direction again.

The crystal orientation portion having the <211> direction appeared at the time of the second-step growth of the pillar-shaped whisker is positioned where the initial nucleus is rotated approximately 57° about the <211> axis. Another portion positioned by rotating the initial nucleus approximately 57° appears by reverse rotation. In addition, others appear through a portion having the <377> direction which grows from the portion having the <211> direction where twin growth is performed in the first-step growth at the first layer. After the second-step growth, twin growth can be performed in the horizontal plane along the <111> direction of the portions positioned by rotating the initial nucleus approximately 57°; as a result, substantially hexagonal external-shape with {111} planes as the side surfaces is provided.

This is the direct cause of a pillar-shaped whisker having an external shape which is substantially hexagonal. Note that the cross section of the pillar-shaped whisker has a hexagonal shape with rounded corners (see FIG. 1B).

This indicates that there are other <111> growth directions which determines the shape of the pillar-shaped whisker other than the direction obtained by rotating the initial nucleus approximately 57°. Then, a portion having the <721> direction will be described with reference to FIG. 7 again. There is no <111> direction from the portion having the <721> direction in the horizontal plane. However, in the case of the downward crystal growth from the second layer to the first layer (alternatively, the crystal growth may be performed in the opposite direction; that is, to the third layer), the portion which is in the substantially <211> direction appears again in the first layer in the second-step growth. This portion is positioned where the initial nucleus is rotated approximately 30° about the <211> axis. The portion having the <211> direction which is positioned by rotating the initial nucleus approximately 30° makes the transverse cross section of the pillar-shaped whisker nearly polygonal. As a result, the pillar-shaped whisker the cross-sectional shape of which is probably a hexagon with round corners is obtained.

In addition, it is likely that another cause of the external shape having isotropy and rounded corners is that each portion positioned by rotating the initial nucleus behaves as a new initial nucleus so as to continue the crystal growth.

Note that which rotation by approximately 57° or approximately 30° is dominant seems to be determined by a relative amount of crystals grown in focused portion. In the model illustrated in FIG. 7, two portions of the <211> direction positioned by rotating the initial nucleus 57° are obtained from the portion having the <377> direction, whereas only one portion of the <211> direction positioned by rotating the initial nucleus 30° is obtained from the portion having the <721> direction. Accordingly, the rotation by approximately 57° is probably dominant; thus, the external shape is rather hexagonal.

Then, (some of) crystal orientations in the case of the second-step growth of the cone-shaped whisker are shown in FIG. 8. As described above, the growth of a pillar-shaped whisker is probably performed in such a manner that the twin growth in the horizontal direction and in the depth direction are closely tangled with each other. However, it is likely that a cone-shaped whisker has less interaction between the growth in the horizontal direction and in the depth direction. This is caused due to the fact that the growth in the horizontal plane direction from the initial nucleus is performed in two <111> directions.

In the cone-shaped whisker, the number of the <111> directions included in the horizontal plane is increased to four after the first-step growth. The number of the <111> directions included in the horizontal plane is further increased to six after the second-step growth. At this time, growth directions A and A' illustrated in FIG. 8 are substantially the same (to be exact, the difference is approximately 7.35°). The two portions having the directions A and A' as the growth direction correspond to the "new twin crystal" described above. Growth directions B and C are inclined to the left from the direction A, which is the growth direction of the new twin crystal, at 70.53° and 141.06°, respectively and the growth directions B' and C' are inclined to the right from the direction A', which is also the growth direction of the new twin crystal, at 70.53° and 141.06°, respectively. It is probable that each of the directions forms a side of the hexagon.

Note that as described above, two $\Sigma=3$ twins of silicon in the pillar-shaped whisker overlap with each other at an angle of approximately 35°. The same can be applied to the cone-shaped whisker. However, the $\Sigma=3$ twins of silicon should be ideally inclined at approximately 38.94° in order to form a new twin crystal.

It is possible that this difference is due to the difference between the angles of the directions A and A'. That is, it is likely that the force is applied in the direction in which the difference between the angles of the directions A and A' is reduced, whereby distortion occurs inside of the twin crystal at the time of twin growth. As a result, two $\Sigma=3$ twins of silicon inclined at an angle of approximately 35° which is deviated by several degrees from the ideal angle are obtained.

In other words, it is highly possible that the growth direction is deviated from the ideal growth direction and distortion is caused, in a plane where the growth directions affect each other at the time of crystal growth. The transverse cross section of a cone-shaped whisker and the longitudinal cross section of a pillar-shaped whisker each correspond to such a plane.

The diffraction patterns of the twin crystal observed in both the pillar-shaped whisker and the cone-shaped whisker show that whisker-like crystalline silicon is formed with a combination of three minute twin crystals. The model of <111> twin growth was proposed as a model for a good explanation of these observation results. With the use of the model of <111> twin growth, in addition to the good explanation of each diffraction pattern of whisker-like crystalline silicon, consideration of the external shape of whisker-like crystalline silicon and distortion which is likely to occur inside of the twin crystal can be obtained.

Whisker-like crystalline silicon described in the present invention can be used in a photoelectric conversion device such as a solar cell and an energy storage device such as an ion-transferring secondary battery. In addition, whisker-like crystalline silicon can be used for a variety of applications in which a needle-like microstructure is needed.

DETAILED DESCRIPTION OF THE INVENTION

Hereinafter, embodiments will be described with reference to the drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

In this embodiment, a structure of a photoelectric conversion device which is one embodiment of the present invention is described with reference to FIGS. 9A to 9C and FIGS. 10A and 10B.

A photoelectric conversion device described in this embodiment includes a first-conductivity-type crystalline silicon region provided over a conductive layer, a crystalline silicon region which is provided over the first-conductivity-type crystalline silicon region and has an uneven surface due to a plurality of densely formed whiskers which are formed of crystalline silicon (whisker-like crystalline silicon), and a second-conductivity-type crystalline silicon region which is provided to cover the uneven surface of the crystalline silicon region having the uneven surface and has an opposite conductivity type to the conductivity type of the first-conductivity-type crystalline silicon. The whisker is a structure which is formed of polycrystalline silicon including the {111} plane as a twin boundary and which grows in the <110> direction or the <211> direction.

Figure 1A:
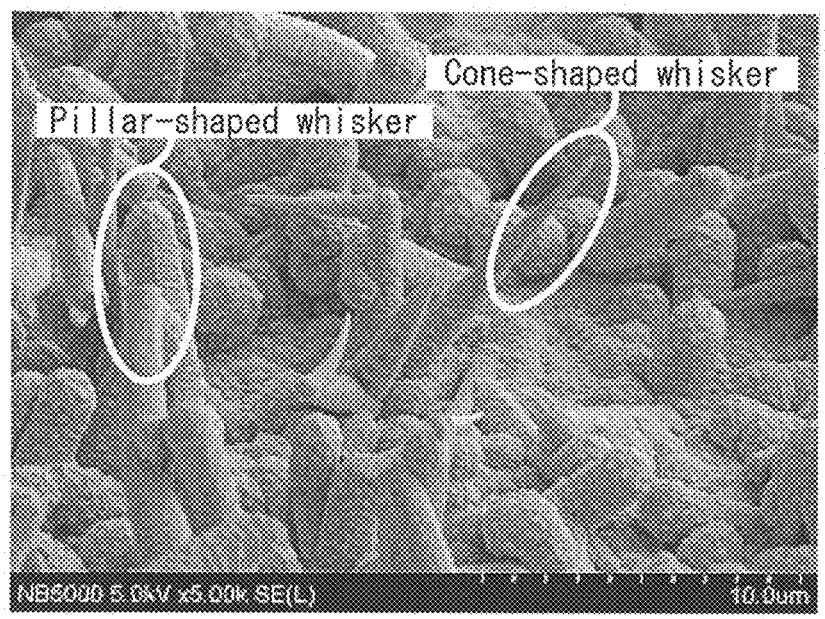
FIGS. 1A and 1B illustrate examples of whiskers.
Figure 1B:
Figure 2A:
FIGS. 2A and 2B illustrate a cross-sectional TEM image of a pillar-shaped whisker and a diffraction pattern thereof.
Figure 2B:
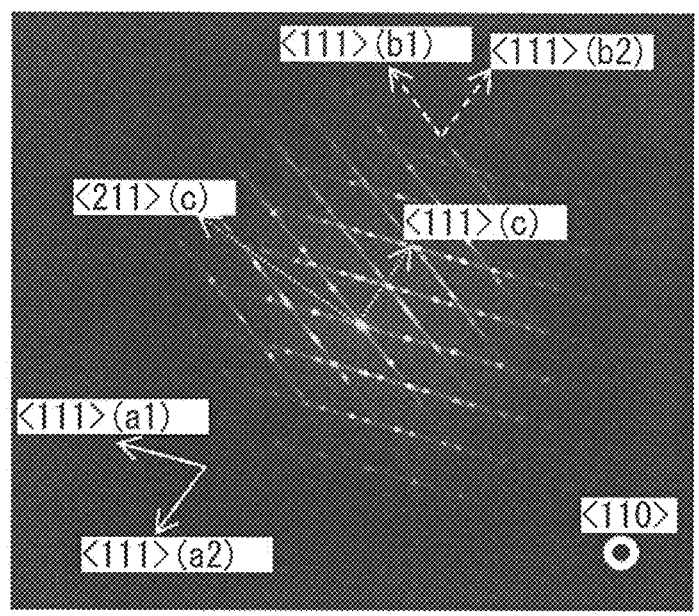
Figure 3A:
FIGS. 3A and 3B illustrate a cross-sectional TEM image of a cone-shaped whisker and a diffraction pattern thereof.
Figure 3B:
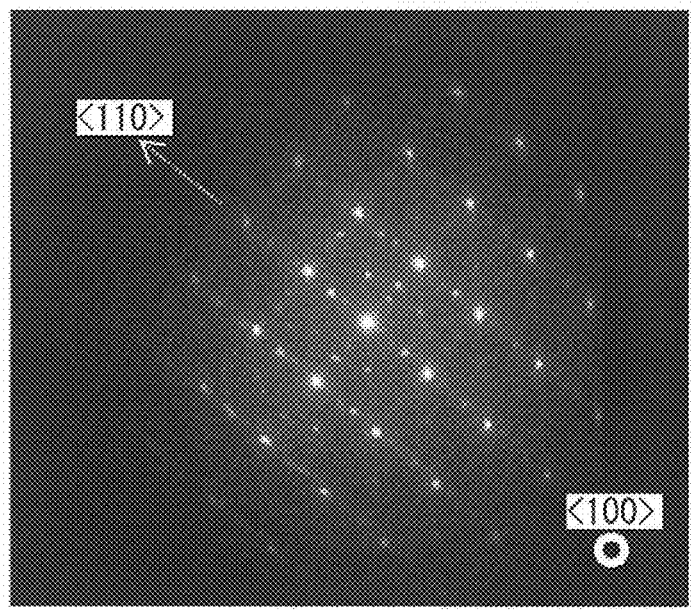
Figure 4A:
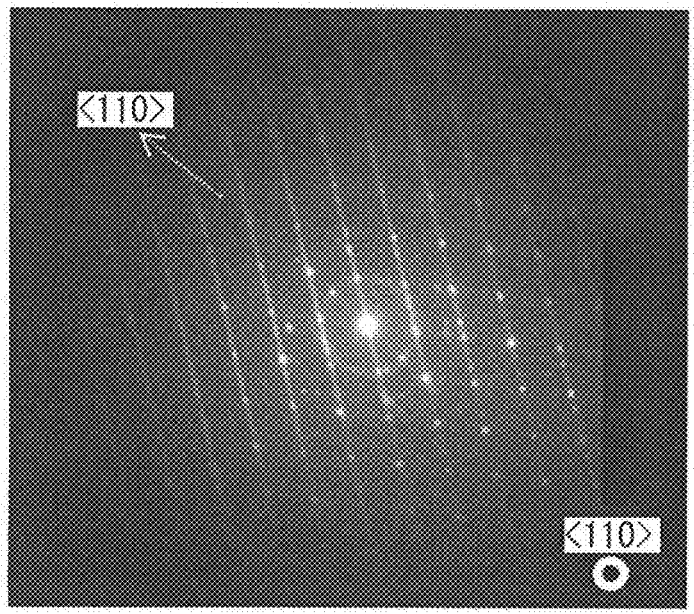
FIGS. 4A and 4B illustrate diffraction patterns of a cone-shaped whisker.
Figure 4B:
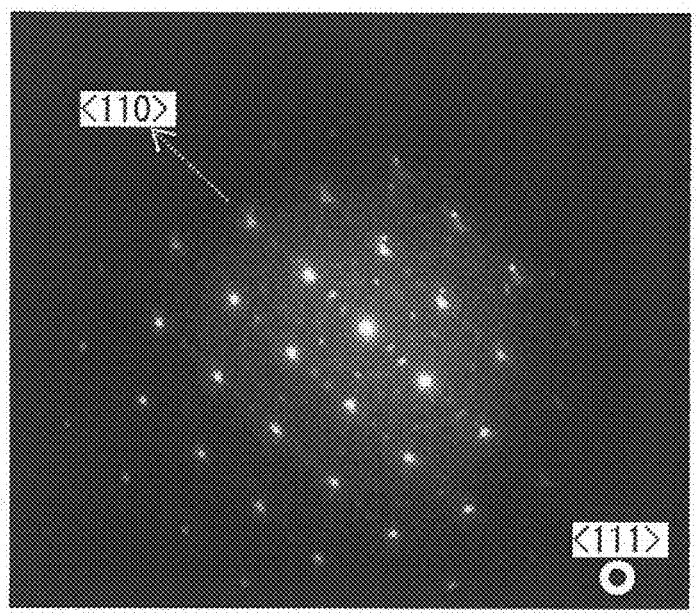
Figure 5A:
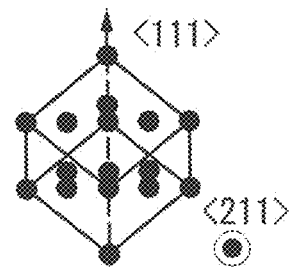
FIGS. 5A and 5B illustrate growth models of a pillar-shaped whisker.
Figure 5B:
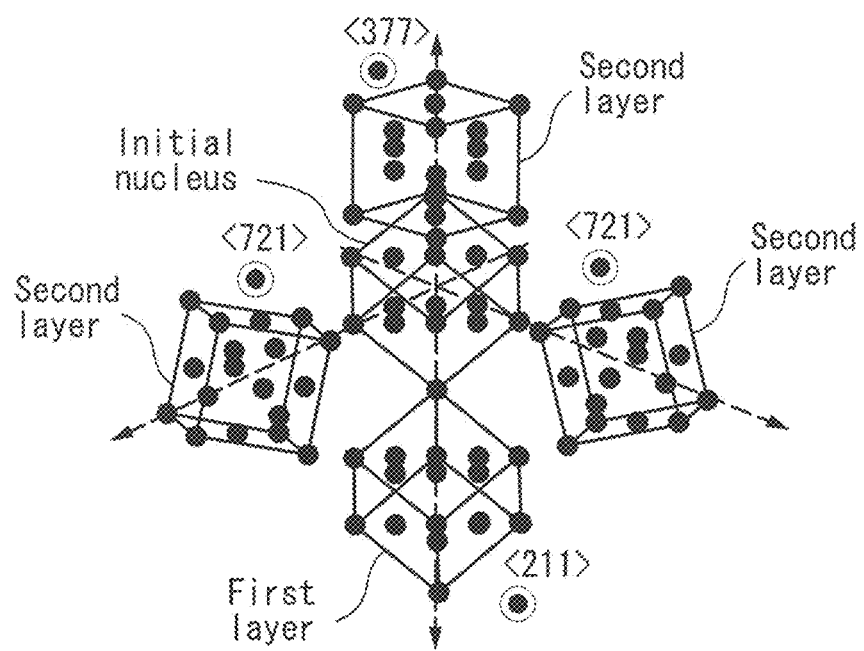
Figure 6A:
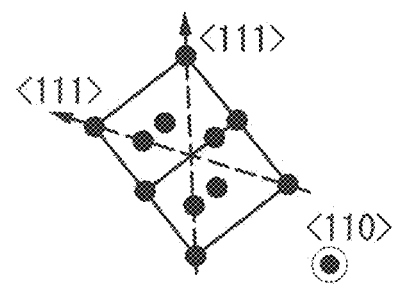
FIGS. 6A and 6B illustrate growth models of a cone-shaped whisker.
Figure 6B:
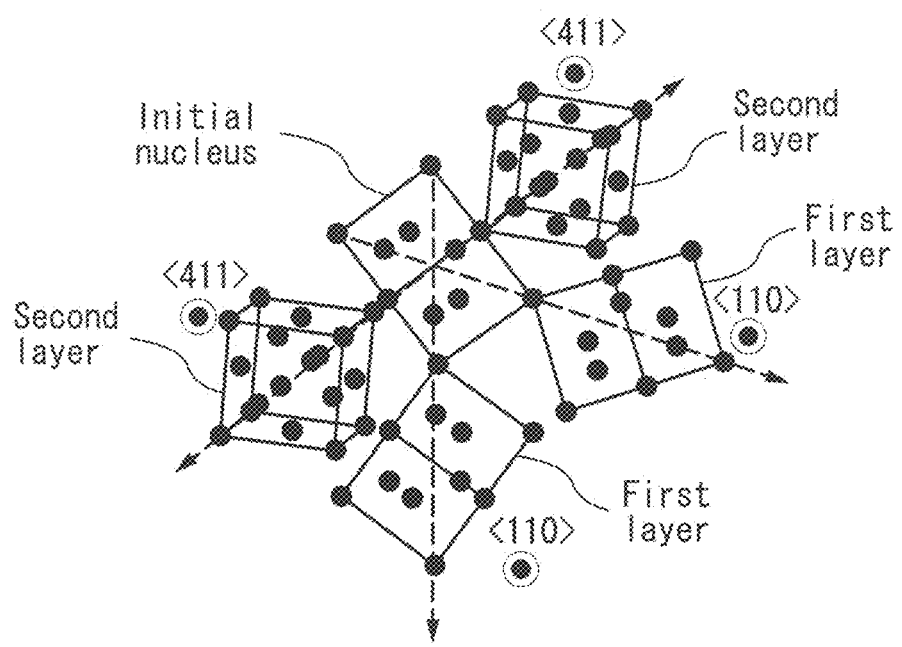
Figure 7:
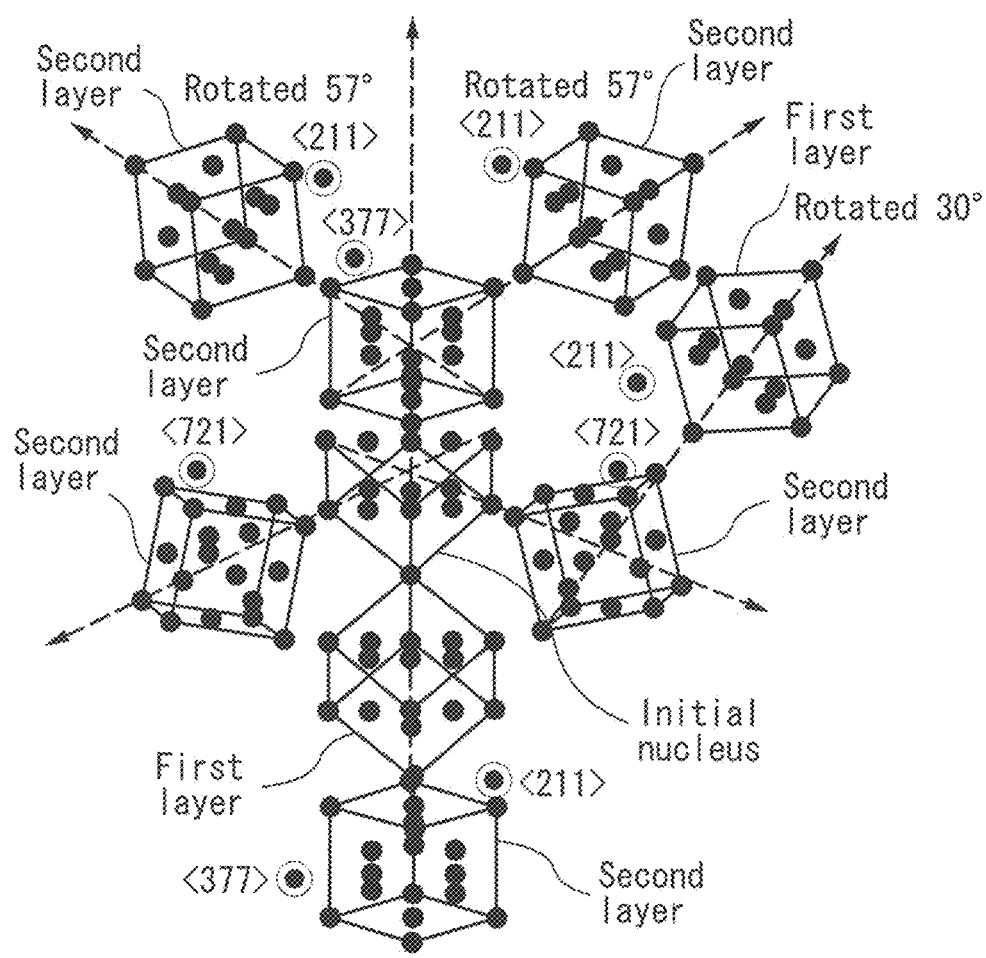
FIG. 7 illustrates a growth model of a pillar-shaped whisker.
Figure 8:
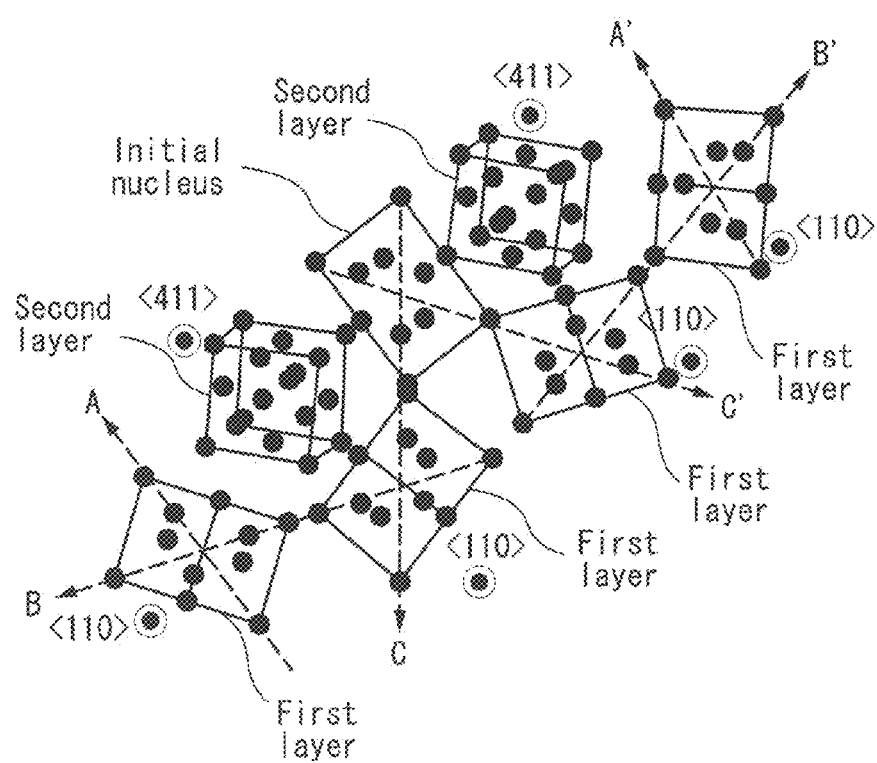
FIG. 8 illustrates a growth model of a cone-shaped whisker.
Figure 9A:
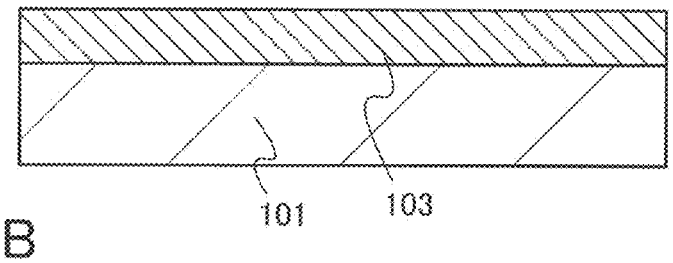
FIGS. 9A to 9C illustrate a manufacturing process of a photoelectric conversion device.
Figure 9B:
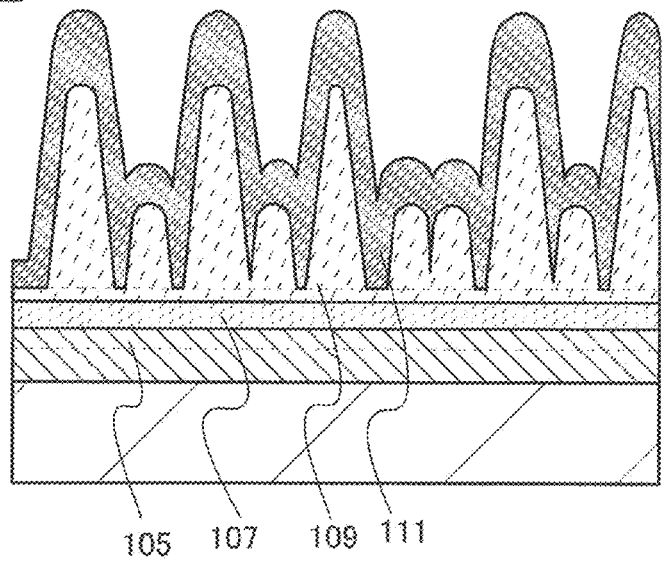
Figure 9C:
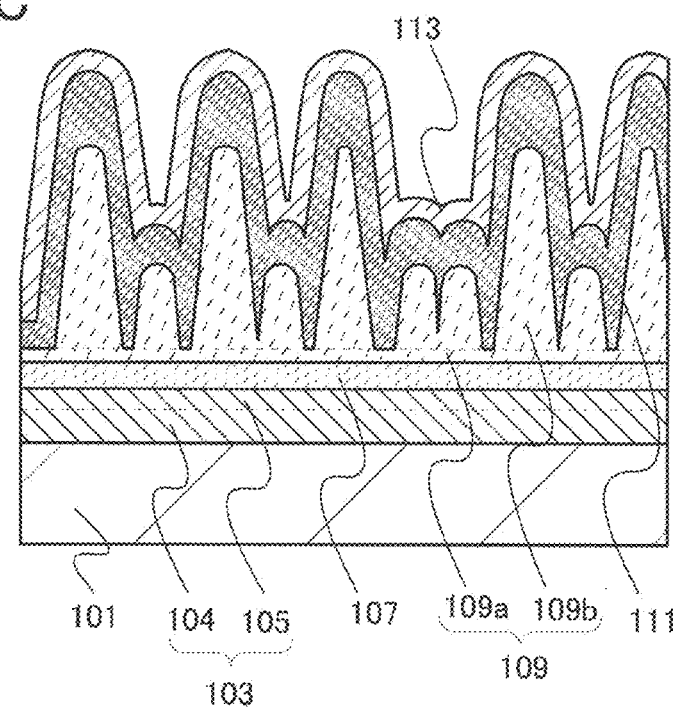

FIG. 9C illustrates a photoelectric conversion device including a substrate 101, an electrode 103, a first-conductivity-type crystalline silicon region 107, an intrinsic crystalline silicon region 109, a second-conductivity-type crystalline silicon region 111 which has an opposite conductivity type to the conductivity type of the first-conductivity-type crystalline silicon region 107, and a transparent conductive layer 113. The first-conductivity-type crystalline silicon region 107, the intrinsic crystalline silicon region 109, and the second-conductivity-type crystalline silicon region 111 function as a photoelectric conversion layer.

Note that in this specification, an "intrinsic semiconductor" refers not only to an intrinsic semiconductor, in the narrow sense, in which the Fermi level lies in the middle of a band gap, but also to a semiconductor in which the concentration of an impurity imparting p-type or n-type conductivity is $1\times10^{20}$ cm$^{-3}$ or lower, and in which photoconductivity is 100 times or more than a dark conductivity. This intrinsic semiconductor may include an impurity element belonging to Group 13 or Group 15 of the periodic table. Such a semiconductor is also included in an intrinsic semiconductor in this specification.

The crystalline silicon region which has an uneven surface due to a plurality of densely formed whiskers which are formed of crystalline silicon is formed in the intrinsic crystalline silicon region. The transparent conductive layer 113 serving as an electrode is formed over the second-conductivity-type crystalline silicon region 111.

In this embodiment, an interface between the electrode 103 and the first-conductivity-type crystalline silicon region 107 is flat. The intrinsic crystalline silicon region 109 includes a flat portion and a plurality of whiskers (a group of whiskers). In other words, the interface between the electrode 103 and the first-conductivity-type crystalline silicon region 107 is flat while a surface of the second-conductivity-type crystalline silicon region 111 is uneven. In addition, an interface between the intrinsic crystalline silicon region 109 and the second-conductivity-type crystalline silicon region 111 is uneven.

In this embodiment, a p-type crystalline silicon layer and an n-type crystalline silicon layer are used for the first-conductivity-type crystalline silicon region 107 and the second-conductivity-type crystalline silicon region 111, respectively; however, the conductivities of the first-conductivity-type crystalline silicon region 107 and the second-conductivity-type crystalline silicon region 111 may be interchanged with each other. As the impurity element imparting the conductivity types, phosphorus or arsenic is used to impart n-type conductivity, and boron is used to impart p-type conductivity.

Since light enters from the transparent conductive layer 113 in the photoelectric conversion device in this embodiment, the second-conductivity-type crystalline silicon region 111 may be formed using a material in which carbon or the like is added to silicon so as to widen a band gap.

As the substrate 101, a glass substrate typified by an aluminosilicate glass substrate, a barium borosilicate glass substrate, an aluminoborosilicate glass substrate, a sapphire substrate, and a quartz substrate can be used. Alternatively, a substrate in which an insulating film is formed over a metal substrate such as a stainless steel substrate may be used. In this embodiment, a glass substrate is used as the substrate 101.

In FIG. 9C, the electrode 103 includes a conductive layer 104 and a mixed layer 105 which is formed on a surface of the conductive layer. Note that the electrode 103 includes only the conductive layer 104 in some cases. Alternatively, the electrode 103 includes only the mixed layer 105 in some cases.

The conductive layer 104 is formed using a metal element which forms silicide by reacting with silicon. Alternatively, the conductive layer 104 may have a stacked layer structure which includes a layer formed using a metal element having high conductivity typified by platinum, aluminum, copper, titanium, and an aluminum alloy to which an element which improves heat resistance, such as silicon, titanium, neodymium, scandium, or molybdenum, is added on the substrate 101 side; and a layer formed using a metal element which forms silicide by reacting with silicon on the first-conductivity-type crystalline silicon region 107 side. Examples of the metal element which forms silicide by reacting with silicon include zirconium, titanium, hafnium, vanadium, niobium, tantalum, chromium, molybdenum, cobalt, nickel, and the like.

The mixed layer 105 may be formed using silicon and the metal element which is included in the conductive layer 104. Note that in the case where the mixed layer 105 is formed using silicon and the metal element which is included in the conductive layer 104, active species of the source gas are supplied to a portion which is being deposited, depending on heat conditions in forming the first-conductivity-type crystalline silicon region by an LPCVD method; therefore, silicon is diffused into the conductive layer 104 and thus the mixed layer 105 is formed.

In the case where the conductive layer 104 is formed using a metal element which forms silicide by reacting with silicon, the silicide of the metal element, typically one or more of zirconium silicide, titanium silicide, hafnium silicide, vanadium silicide, niobium silicide, tantalum silicide, chromium silicide, molybdenum silicide, cobalt silicide, and nickel silicide is/are formed in the mixed layer 105.

The intrinsic crystalline silicon region 109 includes a film-like crystalline silicon region 109a and a group of whiskers 109b which is formed using crystalline silicon over the film-like crystalline silicon region 109a. Note that an interface between the film-like crystalline silicon region 109a and the whisker 109b is unclear. Therefore, a plane that is in the same level as the bottom of the deepest valley of the valleys formed among whiskers 109b and is parallel to a surface of the electrode 103 is regarded as the interface between the film-like crystalline silicon region 109a and the whisker 109b.

The film-like crystalline silicon region 109a covers the first-conductivity-type crystalline silicon region 107. Note that the whisker 109b may have a pillar-like shape such as a cylinder or a prism, or a cone-like shape such as a cone or a pyramid. The top of the whisker 109b may be rounded. The diameter of the whisker 109b is greater than or equal to 100 nm and less than or equal to 10 μm, preferably greater than or equal to 500 nm and less than or equal to 3 μm. Further, the length of the whisker 109b is greater than or equal to 300 nm and less than or equal to 20 μm, preferably greater than or equal to 500 nm and less than or equal to 15 μm. The photoelectric conversion device in this embodiment includes two or more of the above-described whiskers.

In this embodiment, the interface between the intrinsic crystalline silicon region 109 and the second-conductivity-type crystalline silicon region 111 and the surface of the second-conductivity-type crystalline silicon region 111 are uneven. Therefore, reflectance of light incident from the transparent conductive layer 113 can be reduced. In addition, light incident on the photoelectric conversion layer is efficiently absorbed by the photoelectric conversion layer owing to a light-trapping effect. Accordingly, the characteristics of the photoelectric conversion device can be improved.

Figure 10A:
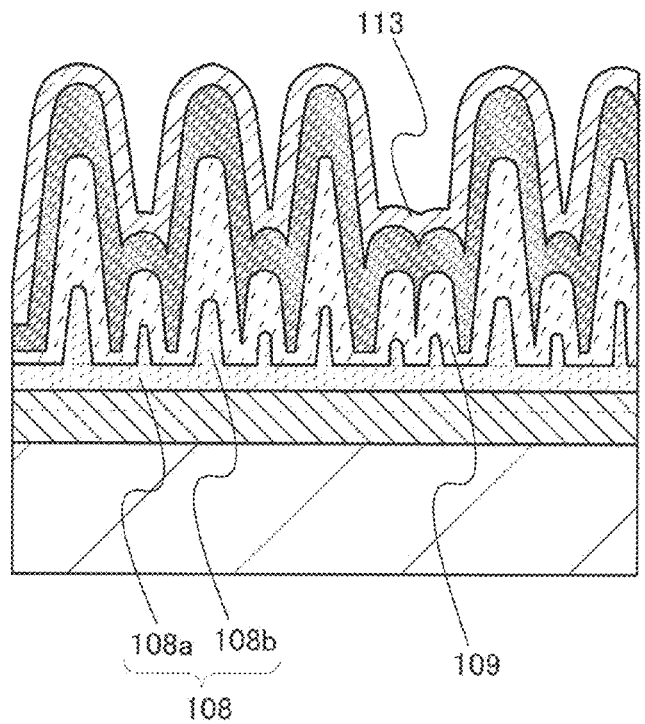
FIGS. 10A and 10B illustrate examples of cross sections of a photoelectric conversion device.

Note that although the interface between the first-conductivity-type crystalline silicon region 107 and the intrinsic crystalline silicon region 109 is flat in FIG. 9C, an interface between a first-conductivity-type crystalline silicon region 108 and the intrinsic crystalline silicon region 109 may be uneven as illustrated in FIG. 10A. The first-conductivity-type crystalline silicon region 108 has an uneven surface formed due to a plurality of whiskers which are densely formed of crystalline silicon including an impurity element imparting the first conductivity type.

The first-conductivity-type crystalline silicon region 108 in FIG. 10A includes a film-like crystalline silicon region 108a and a group of whiskers 108b which is formed using crystalline silicon including an impurity element imparting the first conductivity type over the film-like crystalline silicon region 108a.

Note that the interface between the film-like crystalline silicon region 108a and the whisker 108b is unclear. Therefore, a plane that is in the same level as the bottom of the deepest valley of the valleys formed among whiskers 108b and is parallel to a surface of the electrode 103 is regarded as the interface between the film-like crystalline silicon region 108a and the whisker 108b. Note that the whisker 108b may have a pillar-like shape such as a cylinder or a prism, or a cone-like shape such as a cone or a pyramid. The top of the whisker 108b may be rounded.

In the photoelectric conversion device in FIG. 10A, the interface between the first-conductivity-type crystalline silicon region 108 and the intrinsic crystalline silicon region 109, the interface between the intrinsic crystalline silicon region 109 and the second-conductivity-type crystalline silicon region 111, and the surface of the second-conductivity-type crystalline silicon region 111 are uneven. Therefore, reflectance of light incident from the transparent conductive layer 113 can be reduced. In addition, light incident on the photoelectric conversion layer is efficiently absorbed by the photoelectric conversion layer owing to a light-trapping effect. Accordingly, the characteristics of the photoelectric conversion device can be improved.

Figure 10B:
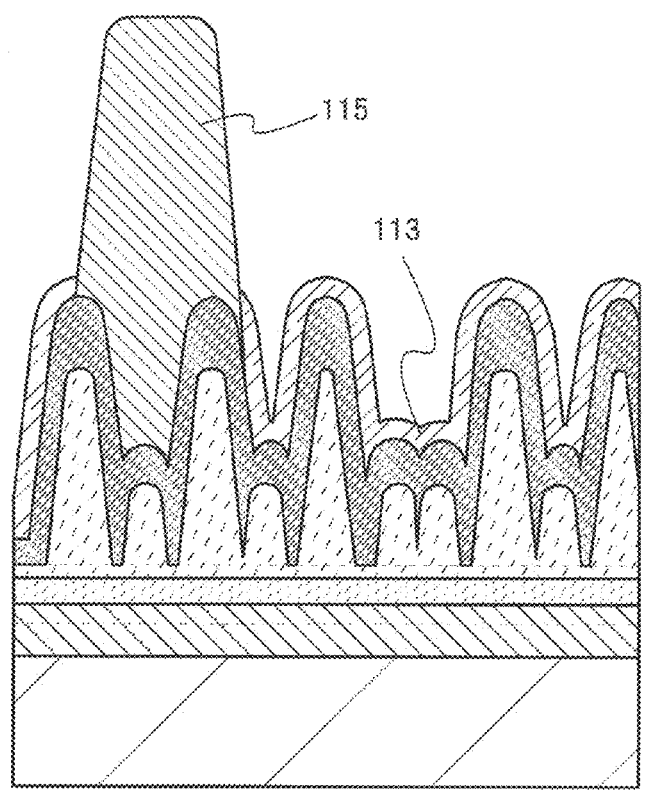

Note that as illustrated in FIG. 10B, a grid electrode 115 for reducing the resistance of the second-conductivity-type crystalline silicon region 111 may be provided over the second-conductivity-type crystalline silicon region 111.

The grid electrode 115 is formed with a layer including a metal element such as silver, copper, aluminum, or palladium. The grid electrode 115 is formed to be in contact with the second-conductivity-type crystalline silicon region 111, whereby resistance loss of the second-conductivity-type crystalline silicon region 111 can be reduced and electrical characteristics, in particular, under high illuminance can be improved.

Next, a manufacturing method of the photoelectric conversion device illustrated in FIG. 9C will be described with reference to FIGS. 9A to 9C. As illustrated in FIG. 9A, the electrode 103 is formed over the substrate 101. The electrode 103 can be formed by a printing method, a sol-gel method, a coating method, an ink jet method, a CVD method, a sputtering method, an evaporation method, or the like, as appropriate. Note that generation density of the whiskers formed later is increased in the case where the electrode 103 is formed as a pattern having a width of 1 μm to 100 μm.

Next, as illustrated in FIG. 9B, the first-conductivity-type crystalline silicon region 107, the intrinsic crystalline silicon region 109, and the second-conductivity-type crystalline silicon region 111 are formed by an LPCVD method. In the LPCVD method, a deposition gas containing at least silicon is used as a source gas while heating is performed at temperatures higher than 550° C. and lower than or equal to the temperature that an LPCVD apparatus and the electrode 103 can withstand, preferably higher than or equal to 580° C. and lower than 650° C. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that hydrogen may be introduced into the source gas.

When the first-conductivity-type crystalline silicon region 107 is formed by an LPCVD method, the mixed layer 105 may be formed between the conductive layer 104 and the first-conductivity-type crystalline silicon region 107 depending on heating conditions. Owing to the mixed layer 105, the characteristics of the interface between the conductive layer 104 and the first-conductivity-type crystalline silicon region 107 (such as adhesiveness) are improved, so that series resistance can be reduced.

The first-conductivity-type crystalline silicon region 107 is formed by an LPCVD method in which diborane and a deposition gas containing silicon are introduced as a source gas into the reaction chamber of an LPCVD apparatus. The thickness of the first-conductivity-type crystalline silicon region 107 is greater than or equal to 5 nm and less than or equal to 500 nm. As a result, a crystalline silicon layer to which boron is added can be obtained as the first-conductivity-type crystalline silicon region 107.

Next, the introduction of diborane into the reaction chamber of the LPCVD apparatus is stopped. Then, the intrinsic crystalline silicon region 109 is formed by an LPCVD method in which a deposition gas containing silicon is introduced as a source gas into the reaction chamber of the LPCVD apparatus. The thickness of the intrinsic crystalline silicon region 109 is greater than or equal to 500 nm and less than or equal to 20 μm. As a result, a crystalline silicon layer including whiskers can be obtained as the intrinsic crystalline silicon region 109.

Then, the second-conductivity-type crystalline silicon region 111 is formed by an LPCVD method in which phosphine or arsine and a deposition gas containing silicon are introduced as a source gas into the reaction chamber of the LPCVD apparatus. The thickness of the second-conductivity-type crystalline silicon region 111 is greater than or equal to 5 nm and less than or equal to 500 nm. Here, a crystalline silicon layer to which phosphorus or arsenic is added is formed as the second-conductivity-type crystalline silicon region 111.

Through the above steps, the photoelectric conversion layer including the first-conductivity-type crystalline silicon region 107, the intrinsic crystalline silicon region 109, and the second-conductivity-type crystalline silicon region 111 can be formed.

Note that, in the manufacturing process of the photoelectric conversion device illustrated in FIG. 9C, in the case where the introduction of diborane into the reaction chamber of the LPCVD apparatus is stopped before whiskers are formed in the first-conductivity-type crystalline silicon region 107, the interface between the first-conductivity-type crystalline silicon region 107 and the intrinsic crystalline silicon region 109 is flat as in FIG. 9C. On the other hand, in the case where the introduction of diborane into the reaction chamber of the LPCVD apparatus is stopped after whiskers are formed in the first-conductivity-type crystalline silicon region 107, the interface between the first-conductivity-type crystalline silicon region 108 and the intrinsic crystalline silicon region 109 is uneven as in FIG. 10A.

A surface of the electrode 103 may be cleaned with hydrofluoric acid before the formation of the first-conductivity-type crystalline silicon region 107. This step can enhance the adhesiveness between the electrode 103 and the first-conductivity-type crystalline silicon region 107.

Further, nitrogen or a rare gas such as helium, neon, argon, or xenon may be added to the source gas of the first-conductivity-type crystalline silicon region 107, of the intrinsic crystalline silicon region 109, and of the second-conductivity-type crystalline silicon region 111. In the case where nitrogen or a rare gas is added to the source gas of the first-conductivity-type crystalline silicon region 107, of the intrinsic crystalline silicon region 109, and of the second-conductivity type semiconductor region 111, the density of whiskers can be increased.

After the formation of one or more of the first-conductivity-type crystalline silicon region 107, the intrinsic crystalline silicon region 109, and the second-conductivity-type crystalline silicon region 111, in the case where the introduction of the source gas into the reaction chamber of the LPCVD apparatus is stopped and the temperature is maintained in a vacuum state (i.e., vacuum heating is performed), the density of whiskers included in the intrinsic crystalline silicon region 109 can be increased.

Next, as illustrated in FIG. 9C, the transparent conductive layer 113 is formed over the second-conductivity-type crystalline silicon region 111. The transparent conductive layer 113 can be formed by a CVD method, a sputtering method, an evaporation method, or the like.

Through the above process, a photoelectric conversion device with high conversion efficiency can be manufactured.

Embodiment 2

In this embodiment, a manufacturing method of a secondary battery which is one embodiment of the present invention will be described. First, a crystalline silicon region is formed over a metal substrate by a thermal CVD method, preferably by an LPCVD method. It is preferable that the surface of the metal substrate be sufficiently roughed at this time. Alternatively, a substrate over which a metal thin film has been deposited may be used instead of the metal substrate. In that case, it is preferable that a pattern having a width of 1 µm or less be formed.

A metal used for the metal substrate may be without particular limitation, a metal element with high conductivity typified by platinum, aluminum, copper, and titanium. Alternatively, the metal substrate may be formed using an aluminum alloy to which an element which improves heat resistance, such as silicon, titanium, neodymium, scandium, or molybdenum, is added. Further alternatively, the metal substrate may be formed using a metal element which forms silicide by reacting with silicon. Examples of the metal element which forms silicide by reacting with silicon include zirconium, titanium, hafnium, vanadium, niobium, tantalum, chromium, molybdenum, tungsten, cobalt, nickel, and the like.

In the case where the crystalline silicon region is formed over the metal substrate by the LPCVD method, a deposition gas containing silicon is used as a source gas while heating is performed at temperatures higher than 550° C. and lower than or equal to the temperature that an LPCVD apparatus and the metal substrate can withstand, preferably higher than or equal to 580° C. and lower than 650° C. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that either one or both of hydrogen and a rare gas such as helium, neon, argon, and xenon may be mixed in the source gas.

Note that oxygen is contained as an impurity in the crystalline silicon region in some cases. This is because oxygen is desorbed from a quartz chamber of the LPCVD apparatus by the heating performed in the formation of the crystalline silicon region by the LPCVD method, and the oxygen diffuses into the crystalline silicon region.

Note that an impurity element imparting one conductivity type, such as phosphorus or boron, may be added to the crystalline silicon region. A crystalline silicon region to which the impurity element imparting one conductivity type, such as phosphorus or boron, are added has higher conductivity, so that the electric conductivity can be increased when the crystalline silicon region is used as an active material.

A mixed layer is formed over the metal substrate so that the mixed layer is interposed between the metal substrate and the crystalline silicon region. The mixed layer is formed using a metal element and silicon. In the case where the metal element includes a metal element which forms silicide by reacting with silicon, the silicide of the metal element, typically one or more of zirconium silicide, titanium silicide, hafnium silicide, vanadium silicide, niobium silicide, tantalum silicide, chromium silicide, molybdenum silicide, tungsten silicide, cobalt silicide, and nickel silicide is/are formed in the mixed layer.

The crystalline silicon region includes a plurality of whiskers. Note that the whisker may have a pillar-like shape (such as a cylinder or a prism) or a cone-like shape (such as a cone or a pyramid).

The top of the whisker may be rounded. The diameter of the whisker is greater than or equal to 100 nm and less than or equal to 10 µm, preferably greater than or equal to 500 nm and less than or equal to 3 µm. Further, the length of the whisker is greater than or equal to 2.5 µm and less than or equal to 1000 µm, preferably greater than or equal to 2.5 µm and less than or equal to 100 µm.

The whisker obtained in such a manner is a structure which includes a twin crystal including the {111} plane as a twin boundary and which grows in the <110> direction or the <211> direction. A large number of stacking faults, distortion, or the like is generated in a process of growth, and a large number of microvoids remain in a crystal body. Therefore, whisker-like crystalline silicon has flexibility. In the case where whisker-like crystalline silicon is used as a negative electrode active material of a lithium-ion secondary battery, the expansion of silicon is reduced and the breakdown of silicon can be controlled, owing to the reduction of the distortion, or the like.

The whisker on the surface of the metal substrate or the crystalline silicon region including the whisker is separated after the whisker is formed over the metal substrate. For example, difference in the solubility in acid between the mixed layer and silicon is utilized for easy separation. Alternatively, the separation may be performed mechanically. In this step, it is important to separate the whisker or the crystalline silicon region including the whisker without causing severe damage to the shape of the whisker. As a result, a film-like crystalline silicon region including a whisker or a number of powdered whiskers may be obtained. Hereinafter, such a material is called whisker-including crystalline silicon.

Figure 11:
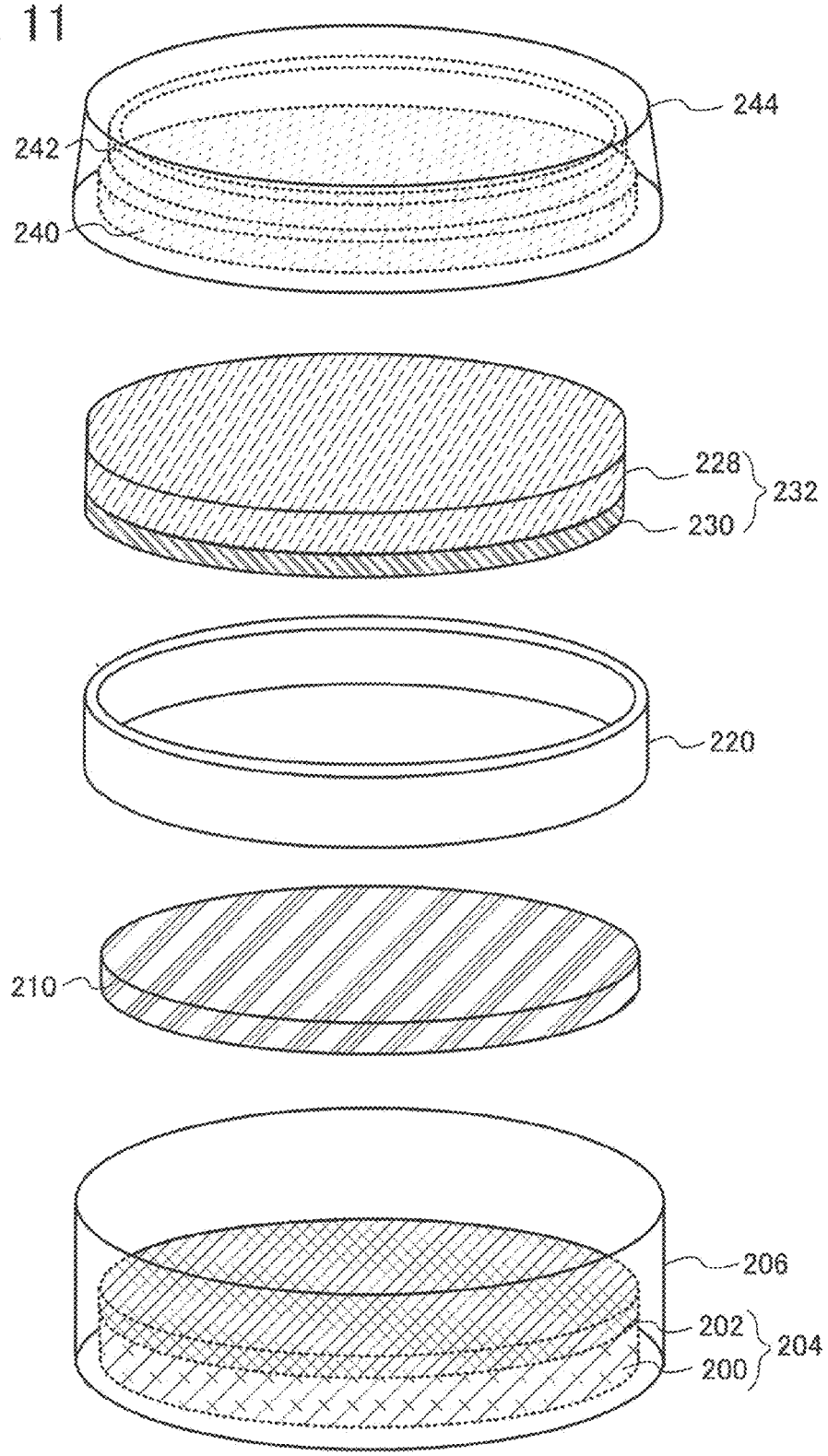
FIG. 11 illustrates an example of a secondary battery.

Next, an active material layer is formed over a current collector. As a material of the current collector, copper is used. As the active material layer, whisker-including crystalline silicon obtained in the above manner is used. Slurry is formed in such a manner that a binder and a conductive auxiliary agent such as acetylene black are mixed with the whisker-including crystalline silicon, and is applied on a negative electrode current collector 200 and dried, whereby a negative electrode active material layer 202 is obtained as illustrated in FIG. 11. The negative electrode active material layer 202 is used for a negative electrode 204 of a coin-type secondary battery.

As illustrated in FIG. 11, the coin-type secondary battery includes a negative electrode 204, a positive electrode 232, a separator 210, an electrolyte (not illustrated), a housing 206, and a housing 244. Besides, the coin-type secondary battery includes a ring-shaped insulator 220, a spacer 240, and a washer 242. As the negative electrode 204, the electrode that is obtained in the above step, in which the negative electrode active material layer 202 is provided over the negative electrode current collector 200, is used.

The electrolyte in which $LiPF_6$ is dissolved in a mixed solvent of ethylene carbonate (EC) and diethyl carbonate (DEC) is preferably used; however one embodiment of the present invention is not limited thereto.

The positive electrode 232 includes a positive electrode active material layer 230 on a positive electrode current collector 228. As a positive electrode current collector, aluminum may be used, for example. A known material such as lithium cobaltate or lithium iron phosphate is used as a positive electrode active material and a mixture of the material, a conductive auxiliary agent, and a binder is used for the positive electrode active material layer 230. In the case where the positive electrode active material does not have enough conductivity, a carbohydrate such as glucose may be mixed at the time of baking of the positive electrode active material, so that positive electrode active material particles are coated with carbon.

An insulator with pores (e.g., polypropylene) may be used for the separator 210. Alternatively, a solid electrolyte which is permeable to lithium ions may be used. In the case where a separator has pores, there is a possibility that silicon, which is used as a negative electrode, enters the positive electrode when silicon is powdered, whereas the possibility is reduced with the use of a material which has no pores and is permeable to lithium ions.

The housing 206, the housing 244, the spacer 240, and the washer 242 each of which is made of metal (e.g., stainless steel) are preferably used. The housing 206 and the housing 244 have a function of electrically connecting the negative electrode 204 and the positive electrode 232 to the outside.

The negative electrode 204, the positive electrode 232, and the separator 210 are soaked in the electrolyte. Then, as illustrated in FIG. 11, the negative electrode 204, the separator 210, the ring-shaped insulator 220, the positive electrode 232, the spacer 240, the washer 242, and the housing 244 are stacked in this order inside the housing 206. The housing 206 and the housing 244 are subjected to pressure bonding. In such a manner, the coin-type secondary battery is manufactured.

Embodiment 3

Whisker-like crystalline silicon or the power storage device described in the Embodiment 2 according to one embodiment of the present invention can be used as a power supply of a variety of electronic and electric devices which are driven with electric power.

The following are given as specific examples of electronic and electric devices: the power storage device according to one embodiment of the present invention, display devices, lighting devices, desktop personal computers or laptop personal computers, image reproduction devices which reproduce a still image or a moving image stored in a recording medium such as a digital versatile disc (DVD), mobile phones, portable game machines, portable information terminals, e-book readers, video cameras, digital still cameras, high-frequency heating apparatus such as microwaves, electric rice cookers, electric washing machines, air-conditioning systems such as air conditioners, electric refrigerators, electric freezers, electric refrigerator-freezers, freezers for preserving DNA, dialysis devices, and the like.

In addition, moving objects driven by an electric motor using electric power from a power storage device are also included in the category of electronic and electric devices. As examples of the moving objects, electric vehicles, hybrid vehicles which include both an internal-combustion engine and a motor, motorized bicycles including motor-assisted bicycles, and the like can be given.

In the electronic and electric devices, the power storage device according to one embodiment of the present invention can be used as a power storage device for supplying enough electric power for almost the whole power consumption (referred to as a main power supply). Further, in the electronic and electric devices, the power storage device according to one embodiment of the present invention can be used as a power storage device which can supply electric power to the electronic and electric devices when the supply of power from the main power supply or a commercial power supply is stopped (such a power storage device is referred to as an uninterruptible power supply). Furthermore, in the electronic and electric devices, the power storage device according to one embodiment of the present invention can be used as a power storage device for supplying electric power to the electronic and electric devices at the same time as the electric power supply from the main power supply or a commercial power supply (such a power storage device is referred to as an auxiliary power supply).

Figure 12:
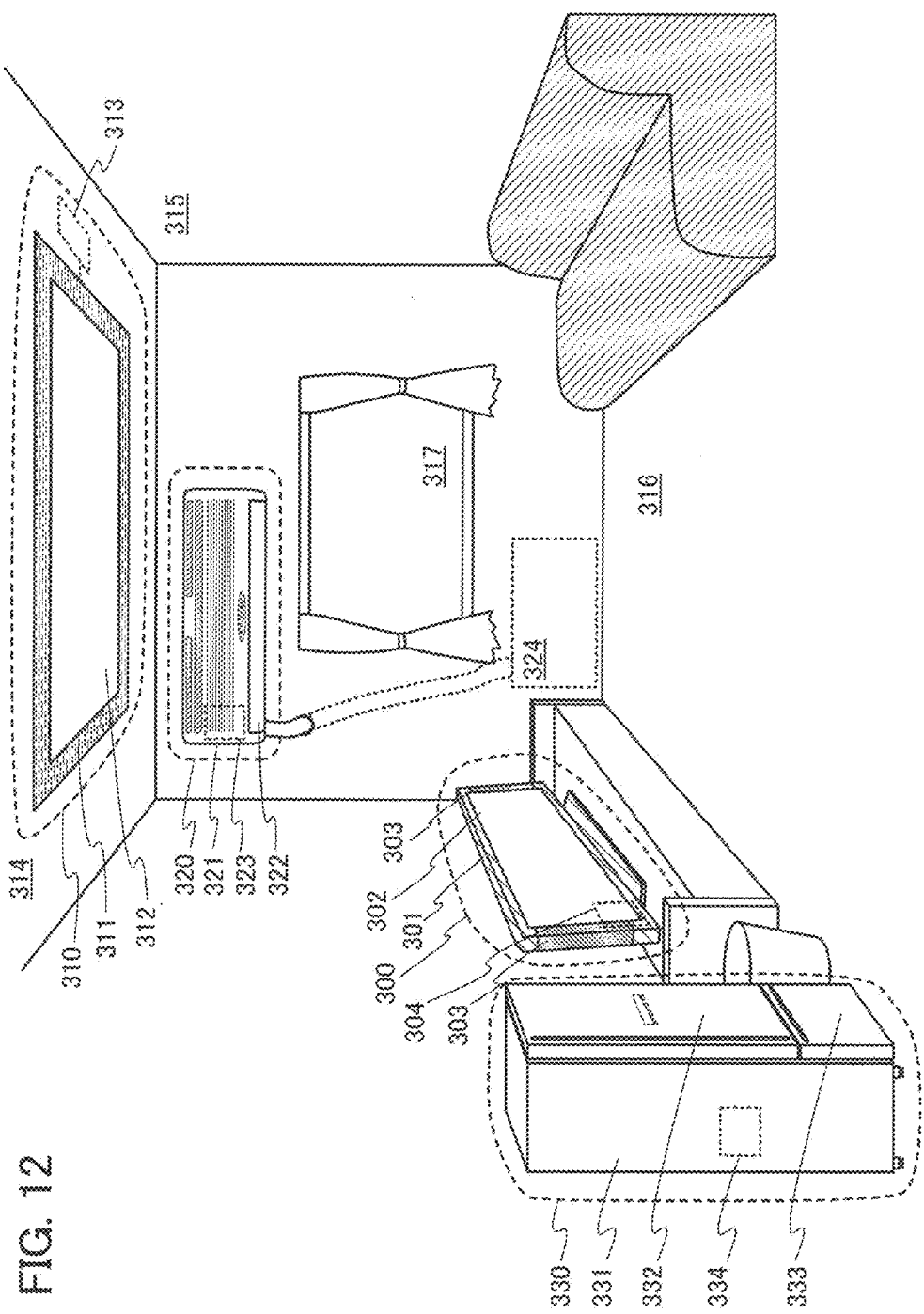
FIG. 12 illustrates application examples of a secondary battery.

FIG. 12 illustrates specific structures of the electronic and electric devices. In FIG. 12, a display device 300 is an example of an electronic and electric device including a power storage device 304 according to one embodiment of the present invention. Specifically, the display device 300 corresponds to a display device for TV broadcast reception and includes a housing 301, a display portion 302, speaker portions 303, the power storage device 304, and the like. The power storage device 304 according to one embodiment of the present invention is provided inside the housing 301.

The display device 300 can receive electric power from a commercial power supply. Alternatively, the display device 300 can use electric power stored in the power storage device 304. Thus, the display device 300 can be operated with the use of the power storage device 304 according to one embodiment of the present invention as an uninterruptible power supply even when electric power cannot be supplied from the commercial power supply due to power failure or the like.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), a field emission display (FED), and the like can be used in the display portion 302.

Note that the display device includes, in its category, all of information display devices for personal computers, advertisement displays, and the like other than TV broadcast reception.

In FIG. 12, an installation lighting device 310 is an example of an electric device including a power storage device 313 according to one embodiment of the present invention. Specifically, the lighting device 310 includes a housing 311, a light source 312, a power storage device 313, and the like. FIG. 12 illustrates the case where the power storage device 313 is provided in a ceiling 314 on which the housing 311 and the light source 312 are installed; alternatively, the power storage device 313 may be provided in the housing 311.

The lighting device 310 can receive electric power from the commercial power supply. Alternatively, the lighting device 310 can use electric power stored in the power storage device 313. Thus, the lighting device 310 can be operated with the use of the power storage device 313 according to one embodiment of the present invention as an uninterruptible power supply even when electric power cannot be supplied from the commercial power supply due to power failure or the like.

Note that although the installation lighting device 310 provided in the ceiling 314 is illustrated in FIG. 12 as an example, the power storage device according to one embodiment of the present invention can be used in an installation lighting device provided in, for example, a wall 315, a floor 316, a window 317, or the like other than the ceiling 314. Alternatively, the power storage device can be used in a tabletop lighting device and the like.

As the light source 312, an artificial light source which obtains light artificially by using electric power can be used. Specifically, a discharge lamp such as an incandescent lamp and a fluorescent lamp, and a light-emitting element such as an LED and an organic EL element are given as examples of the artificial light source.

In FIG. 12, an air conditioner including an indoor unit 320 and an outdoor unit 324 is an example of an electric device including a power storage device 323 according to one embodiment of the present invention. Specifically, the indoor unit 320 includes a housing 321, a ventilation duct 322, a power storage device 323, and the like. FIG. 12 illustrates the case where the power storage device 323 is provided in the indoor unit 320; alternatively, the power storage device 323 may be provided in the outdoor unit 324. Further alternatively, the power storage devices 323 may be provided in both the indoor unit 320 and the outdoor unit 324.

The air conditioner can receive electric power from the commercial power supply. Alternatively, the air conditioner can use electric power stored in the power storage device 323. Specifically, in the case where the power storage devices 323 are provided n both the indoor unit 320 and the outdoor unit 324, the air conditioner can be operated with the use of the power storage device 323 according to one embodiment of the present invention as an uninterruptible power supply even when electric power cannot be supplied from the commercial power supply due to power failure or the like.

Note that although the separated air conditioner including the indoor unit and the outdoor unit is illustrated in FIG. 12 as an example, the power storage device according to one embodiment of the present invention can be used in an air conditioner in which the functions of an indoor unit and an outdoor unit are integrated in one housing.

In FIG. 12, an electric refrigerator-freezer 330 is an example of an electronic and electric device including a power storage device 334 according to one embodiment of the present invention. Specifically, the electric refrigerator-freezer 330 includes a housing 331, a door for a refrigerator 332, a door for a freezer 333, the power storage device 334, and the like. The power storage device 334 is provided in the housing 331 in FIG. 12. The electric refrigerator-freezer 330 can receive electric power from the commercial power supply. Alternatively, the electric refrigerator-freezer 330 can use electric power stored in the power storage device 334. Thus, the electric refrigerator-freezer 330 can be operated with the use of the power storage device 334 according to one embodiment of the present invention as an uninterruptible power supply even when electric power cannot be supplied from the commercial power supply due to power failure or the like.

Note that among the electronic and electric devices described above, a high-frequency heating apparatus such as a microwave and an electric device such as an electric rice cooker require high electric power in a short time. The tripping of a circuit breaker of a commercial power supply in use of electric devices can be prevented by using the power storage device according to one embodiment of the present invention as an auxiliary power supply for supplying electric power which cannot be supplied enough by a commercial power supply.

In addition, in a time period when electronic and electric devices are not used, specifically when a rate of actual use of electric power with respect to the total amount of electric power which can be supplied by a commercial power supply source (such a rate referred to as a usage rate of electric power) is low, electric power can be stored in the power storage device, whereby the usage rate of electric power can be reduced in a time period when the electronic and electric devices are used. In the case of the electric refrigerator-freezer 330, electric power can be stored in the power storage device 334 at night time when the temperature is low and the door for a refrigerator 332 and the door for a freezer 333 are not opened or closed. Meanwhile, the power storage device 334 is used as an auxiliary power supply in daytime when the temperature is high and the door for a refrigerator 332 and the door for a freezer 333 are opened and closed; thus, the usage rate of electric power in daytime can be reduced.

This application is based on Japanese Patent Application serial no. 2010-210579 filed with Japan Patent Office on Sep. 21, 2010, the entire contents of which are hereby incorporated by reference.

What is claimed is:

1. A secondary battery comprising:
a negative electrode active material layer comprising a crystalline silicon including a plurality of whiskers over a negative electrode current collector;
a separator over the negative electrode active material layer;
a positive electrode active material layer over the separator; and
a positive electrode current collector over the positive electrode active material layer,
wherein the plurality of whiskers comprises a whisker having a cone shape where a diameter gradually decreases from a root of the whisker to a tip of the whisker forming a sharp end of the whisker,
wherein the whisker comprises a polycrystalline silicon,
wherein the whisker has a growth direction of <110>,
wherein the whisker includes a twin crystal including a {111} plane as a twin boundary, and
wherein a concentration of elements other than silicon in the whisker is less than or equal to 1 atomic %.

2. The secondary battery according to claim 1, wherein the cone shape is a cone or a pyramid.

3. The secondary battery according to claim 1, wherein the whisker has a diameter greater than or equal to 500 nm and less than or equal to 3 μm.

4. The secondary battery according to claim 1, wherein the whisker has a length greater than or equal to 2.5 μm and less than or equal to 100 μm.

5. A secondary battery comprising:
a negative electrode active material layer comprising a crystalline silicon including a plurality of whiskers over a negative electrode current collector;
a separator over the negative electrode active material layer;
a positive electrode active material layer over the separator; and
a positive electrode current collector over the positive electrode active material layer,
wherein the plurality of whiskers comprises a first whisker having a cone shape where a diameter gradually decreases from a root of the first whisker to a tip of the first whisker forming a sharp end of the first whisker, and a second whisker having a pillar shape,
wherein the first whisker comprises a polycrystalline silicon,
wherein the first whisker has a first growth direction of <110>,
wherein the second whisker has a second growth direction,
wherein the first whisker includes a twin crystal including a {111} plane as a twin boundary, and
wherein a concentration of elements other than silicon in each of the first whisker and the second whisker is less than or equal to 1 atomic %.

6. The secondary battery according to claim 5, wherein the second growth direction is a <211> direction.

7. The secondary battery according to claim 5, wherein the cone shape is a cone or a pyramid.

8. The secondary battery according to claim 5, wherein the pillar shape is a cylinder or a prism.

9. The secondary battery according to claim 5, wherein the first whisker has a diameter greater than or equal to 500 nm and less than or equal to 3 μm.

10. The secondary battery according to claim 5, wherein the first whisker has a length greater than or equal to 2.5 μm and less than or equal to 100 μm.

11. The secondary battery according to claim 5, wherein the second whisker has a hexagonal external shape.

12. A secondary battery comprising:
a negative electrode active material layer comprising a crystalline silicon including a plurality of whiskers over a negative electrode current collector;
a separator over the negative electrode active material layer;
a positive electrode active material layer over the separator; and
a positive electrode current collector over the positive electrode active material layer,
wherein the plurality of whiskers comprises a first whisker having a cone shape where a diameter gradually decreases from a root of the first whisker to a tip of the first whisker forming a sharp end of the first whisker, and a second whisker having a pillar shape,
wherein the first whisker comprises a polycrystalline silicon,
wherein the second whisker comprises a polycrystalline silicon,
wherein the first whisker has a first growth direction of <110>,
wherein the second whisker has a second growth direction,
wherein the first whisker includes a twin crystal including a {111} plane as a twin boundary,
wherein the second whisker includes a twin crystal including a {111} plane as a twin boundary, and
wherein a concentration of elements other than silicon in each of the first whisker and the second whisker is less than or equal to 1 atomic %.

13. The secondary battery according to claim 12, wherein the second growth direction is a <211> direction.

14. The secondary battery according to claim 12, wherein the cone shape is a cone or a pyramid.

15. The secondary battery according to claim 12, wherein the pillar shape is a cylinder or a prism.

16. The secondary battery according to claim 12, wherein the first whisker has a diameter greater than or equal to 500 nm and less than or equal to 3 μm.

17. The secondary battery according to claim 12, wherein the first whisker has a length greater than or equal to 2.5 μm and less than or equal to 100 μm.

18. The secondary battery according to claim 12, wherein the second whisker has a hexagonal external shape.

* * * * *